(12) United States Patent
Fkih et al.

(10) Patent No.: US 10,496,506 B2
(45) Date of Patent: Dec. 3, 2019

(54) SELF-TEST CAPABLE INTEGRATED CIRCUIT APPARATUS AND METHOD OF SELF-TESTING AN INTEGRATED CIRCUIT

(71) Applicant: u-blox AG, Thalwil (CH)

(72) Inventors: Yassine Fkih, Thalwil (CH); Djordje Zegarac, Thalwil (CH); Eric Demey, Thalwil (CH); Luca Plutino, Thalwil (CH); Marzia Sapienza, Thalwil (CH)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 15/815,847

(22) Filed: Nov. 17, 2017

(65) Prior Publication Data
US 2018/0145041 A1 May 24, 2018

(30) Foreign Application Priority Data
Nov. 18, 2016 (EP) .................... 16199631

(51) Int. Cl.
*G06F 11/27* (2006.01)
*G01R 31/28* (2006.01)
(Continued)

(52) U.S. Cl.
CPC .......... *G06F 11/27* (2013.01); *G01R 31/2851* (2013.01); *G01R 31/318533* (2013.01);
(Continued)

(58) Field of Classification Search
CPC .......... H01L 23/58; H01L 2225/06596; G06F 11/27; G06F 11/2236; G01R 31/318555; G01R 31/2851; G01R 31/318533
See application file for complete search history.

(56) References Cited

U.S. PATENT DOCUMENTS 6,223,312 B1 * 4/2001 Nozuyama .............. G06F 11/27
714/724
6,237,123 B1 * 5/2001 Kim ................. G01R 31/31707
714/30
(Continued)

OTHER PUBLICATIONS

J. Moreau, T. Droniou, P. Lebourg and P. Armagnat, "Running scan test on three pins: yes we can!," 2009 International Test Conference, Austin, TX, 2009, pp. 1-10.*
(Continued)

*Primary Examiner* — Cynthia Britt
(74) *Attorney, Agent, or Firm* — Finnegan, Henderson, Farabow, Garrett & Dunner LLP

(57) ABSTRACT

A self-test capable integrated circuit apparatus includes a pattern generator, a results store and testable logic. The testable logic includes a plurality of scan channels, each of the channels being respectively coupled between the pattern generator and the results store. A self-test controller is arranged to supervise a self-test in respect of the testable logic to generate self-test result data, the self-test result data being stored in the results store. A processing resource is coupled to the self-test controller and coupled between the pattern generator and the results store, the processing resource being capable of evaluating the self-test result data stored in the results store. The testable logic includes the processing resource, arranged to cooperate with the self-test controller. The processing resource is able, subsequent to the self-test, to evaluate the self-test result data.

20 Claims, 5 Drawing Sheets

(51) Int. Cl.
*G01R 31/3185* (2006.01)
*G06F 11/22* (2006.01)
*H01L 23/58* (2006.01)

(52) U.S. Cl.
CPC .. *G01R 31/318555* (2013.01); *G06F 11/2236* (2013.01); *H01L 23/58* (2013.01); *H01L 2225/06596* (2013.01)

(56) References Cited

U.S. PATENT DOCUMENTS

| | | | |
|---|---|---|---|
| 9,588,177 B1 * | 3/2017 | Atwood | G01R 31/31707 |
| 2009/0327824 A1 | 12/2009 | Alaniz et al. | |
| 2011/0239070 A1 * | 9/2011 | Morrison | G06F 11/2236 |
| | | | 714/731 |
| 2016/0033571 A1 | 2/2016 | Forlenza et al. | |

OTHER PUBLICATIONS

Logic BIST: State-of-the-Art and Open Problems. Nan Li, Gunnar Carlsson, Elena Dubrova, Kim Petersen; CoRR abs/1503.04628 (2015).

* cited by examiner

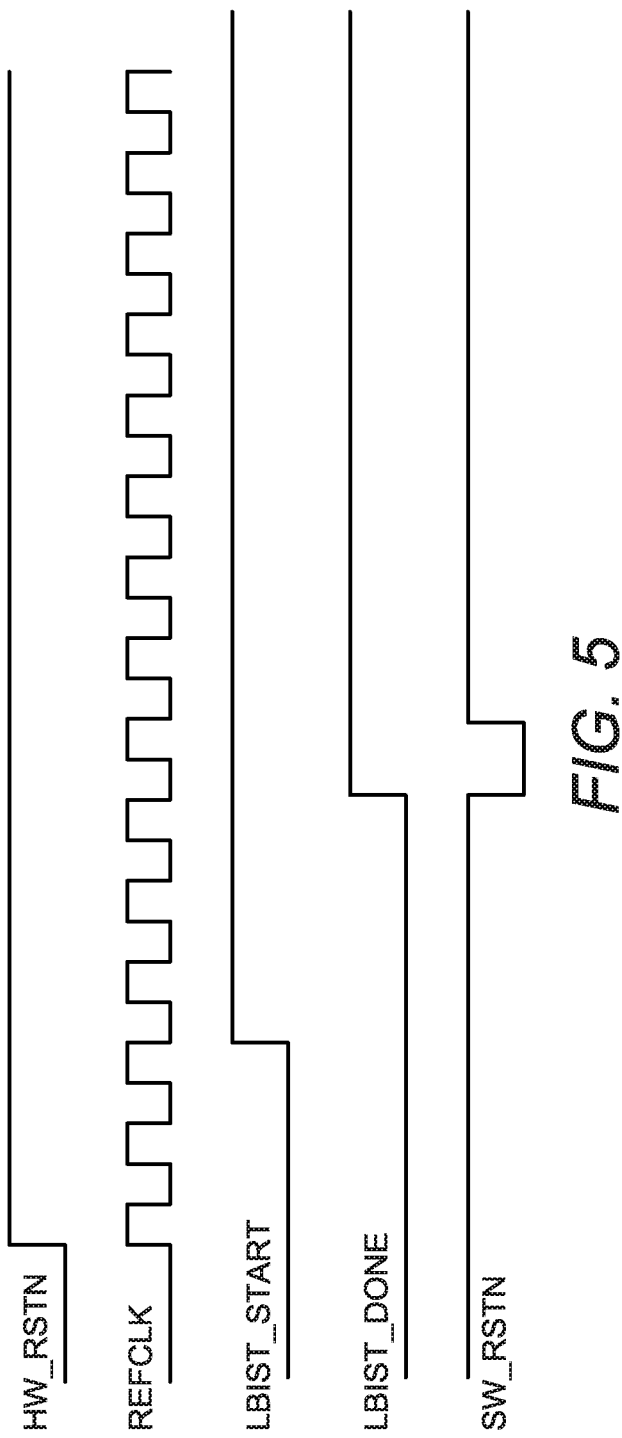

SELF-TEST CAPABLE INTEGRATED CIRCUIT APPARATUS AND METHOD OF SELF-TESTING AN INTEGRATED CIRCUIT

PRIORITY STATEMENT

The present application hereby claims priority under 35 U.S.C. § 119 to European patent application number EP 16199631.9 filed Nov. 18, 2016, the entire contents of which are hereby incorporated herein by reference.

FIELD

The present invention relates to a self-test capable integrated circuit apparatus, the apparatus being of the type that, for example, comprises testable logic including a processing resource. The present invention also relates to a method of self-testing an integrated circuit, the method being of the type that, for example, comprises self-testing testable logic including a processing resource.

BACKGROUND

In order to ensure reliable operation, integrated circuits require testing. Depending upon what is required of the testing, different testing techniques are available. However, it is becoming increasingly complex to test integrated circuits and new techniques are required in order to meet new safety regulations. For example, there is an increasing demand for the deployment of so-called "in-field" test solutions for integrated circuits. Indeed, in the automotive industry, in the context of compliance with most recent standards for functional safety, such as ISO 26262, a Logic Built-In Self-Test (LBIST) mechanism is employed to provide in-field testing so as to maintain a periodical test of the logic of an integrated circuit during the life of the integrated circuit. LBIST is hardware and/or software that is built into the integrated circuit so that the integrated circuit can test its operation.

"Logic BIST: State-of-the-Art and Open Problems." (Nan Li, Gunnar Carlsson, Elena Dubrova, Kim Petersen; CoRR abs/1503.04628 (2015)) provides a review of LBIST technology.

US patent publication no 2016/033571 discloses a method of performing root cause identification for a failure on an integrated circuit with an LBIST system. The system includes one or more channel scan paths having one or more macros associated therewith, each of the one or more channel scan paths being executed during a test cycle. The channel scan paths extend between a pseudo random pattern generator and a Multiple Input Signal Register (MISR). A processor is provided to initiate one or more of the test cycles via an LBIST controller. However, the architecture disclosed requires the integrated circuit to comprise an on-chip test processing capability in order to manage the testing of the part of the logic of the integrated circuit to be tested. As such, the on-chip test processing capability is not subject to testing and so the testing of the integrated circuit as a whole is less robust as the on-chip test processing capability remains untested as part of the LBIST.

US patent publication no. 2009/327824 also discloses a plurality of test channels extending between a pseudo random pattern generator and an MISR. A memory module is provided to store LBIST test parameters and the signatures (results). Decision logic is provided, additional to the logic to be scanned, but as with the on-chip test processing capability of US 2016/033571 the decision logic itself is not subject to testing.

Even for implementations where the scanned logic and the logic controlling the scanning take turns in scanning each other, the use of dedicated logic to conduct the testing of the logic to be scanned represents a waste of die space.

SUMMARY

According to the present invention, there is provided a self-test capable integrated circuit apparatus comprising: a pattern generator; a results store; testable logic comprising a plurality of scan channels, each of the plurality of scan channels being respectively operably coupled between the pattern generator and the results store; a self-test controller arranged to supervise, when in use, a self-test in respect of the testable logic to generate self-test result data, the self-test result data being stored in the results store; and a processing resource operably coupled to the self-test controller and operably coupled between the pattern generator and the results store, the processing resource being capable of evaluating the self-test result data stored in the results store; wherein the testable logic comprises the processing resource, and the processing resource is arranged to cooperate with the self-test controller so that the self-test is also in respect of the processing resource and the processing resource is able subsequent to the self-test to evaluate the self-test result data.

The processor may be arranged to boot into a self-test mode that supports the evaluation of the self-test result data.

The apparatus may further comprise: a test completed indicator store; wherein the self-test controller may be arranged to modify a content of the test completed indicator store upon completion of the self-test, thereby storing an indication that the self-test has been completed.

The self-test controller may be arranged to generate a test completed signal.

The apparatus may further comprise: a reset circuit arranged to translate the test completed signal into a reset signal. The reset signal may be a pulse-shaped signal.

The reset circuit may further comprise: a logical XNOR gate having a first input arranged to receive the test completed signal and a second input arranged to receive a time delayed version of the test completed signal; an output signal may be generated by the logical XNOR gate constituting the reset signal.

The apparatus may further comprise: a delay element arranged to receive the test completed signal and to delay the test completed signal by a predetermined period of time, thereby generating the time delayed version of the test completed signal.

The processing resource may have a normal operating mode and a self-test mode into which the processing resource temporarily enters upon booting.

The self-test mode may comprise the processing resource accessing the test completed indicator store in order to determine whether the self-test has been performed.

The processing resource may be arranged to perform the evaluation of the self-test result data in response to the test completed indicator store comprising an indication that the self-test has been performed.

The apparatus may further comprise: an expected results data store arranged to store expected self-test result data; wherein the evaluation of the self-test result data may comprise the processing resource accessing the expected results data store and the results store and comparing the self-test result data with the expected self-test result data.

The self-test may test the plurality of scan channels substantially simultaneously with the processing resource.

The testable logic may have a power-up sequence associated therewith; the processing resource may be arranged to program the self-test controller upon completion of the power-up sequence.

The processing resource may comprise digital logic arranged to supervise the power-up sequence.

The self-test controller may be arranged to execute the programming provided by the processing resource following completion of the programming.

The processing resource may be a processor.

According to the present invention, there is also provided a method of self-testing an integrated circuit, the method comprising: a processing resource programming a self-test controller to perform a self-test in respect of testable logic comprising a plurality of scan channels and the processing resource; performing the self-test in respect of the plurality of scan channels and the processing resource by applying digital data patterns respectively to inputs of the plurality of scan channels and the processing resource; storing data generated by the plurality of scan channels and the processing resource in response to the digital data patterns; resetting the testable logic; the processing resource evaluating after the reset the data generated as a result of executing the self-test.

It is thus possible to provide an apparatus and method capable of self-testing testable logic without the need for supplementary logic external to the logic to be tested, for example to initiate and/or verify result data. The apparatus and method thus also allow self-testing in a single step so that one part of an integrated circuit does not need to test another part of the integrated circuit and vice versa. It is also possible to provide storage of expected result data in a re-writable manner, thereby supporting variations to a self-test. Furthermore, the apparatus is capable of testing itself automatically at power-up, or the testing can be implemented at any time subsequent to power-up for user specific applications or to run periodic checks of the digital logic of an integrated circuit. Using the logic to be scanned as decision-making logic for the purpose of self-testing is especially beneficial where the scanned logic comprises a processor or other calculation unit, which supervises powering-up of the integrated circuit. In this respect, the processor has access to all components of the integrated circuit, including memory elements such as Read Only Memory or One-Time Programmable memory from which a boot sequence is decoded and/or a user-specific LBIST test can be performed, thereby making the processor particularly suited to participate in self-testing whilst also being testable by self-testing.

BRIEF DESCRIPTION OF THE DRAWINGS

At least one embodiment of the invention will now be described, by way of example only, with reference to the accompanying drawings, in which:

FIG. 5 is a timing diagram of signals generated in self-test capable integrated circuit apparatus employing the method of FIG. 4.

DETAILED DESCRIPTION OF THE EXAMPLE EMBODIMENTS

Figure 1:
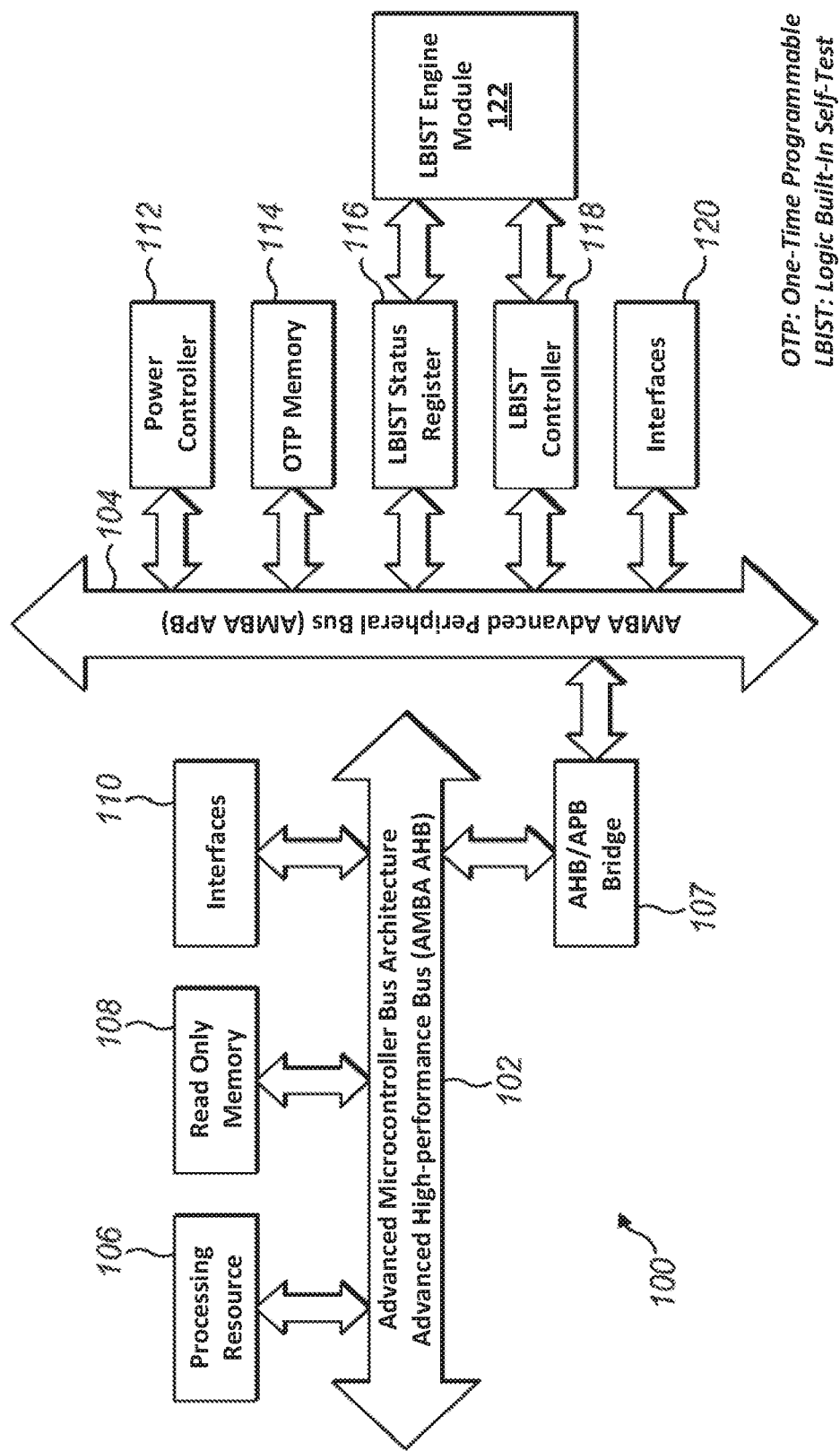
FIG. 1 is a schematic diagram of an integrated circuit supporting self-testing.

Throughout the following description identical reference numerals will be used to identify like parts.

Referring to FIG. 1, an integrated circuit 100 comprises an Advanced Microcontroller Bus Architecture (AMBA) Advanced High-performance Bus (AHB) 102 operably coupled to an AMBA Advanced Peripheral Bus (APB) 104 via an AHB/APB bridge 107. This is, of course, an example of an integrated circuit architecture and the skilled person should appreciate that the use of other interconnectivity architectures is conceivable.

A processing resource 106, for example a processor, is operably coupled to the AMBA AHB 102. A non-volatile memory, for example a Read Only Memory (ROM) 108, is also operably coupled to the AMBA AHB 102. In order to support access to the AMBA AHB 102 by other functional entities, the skilled person will also appreciate that other interfaces 110 can be provided to support operable coupling of other architectural blocks to the AMBA AHB 102.

Turning to the AMBA APB 104, an on-chip power controller 112, a digital memory, for example a One-Time Programmable (OTP) memory 114, a test completed indicator store, for example a Logic Built-In Self-Test (LBIST) status register 116, and self-test controller, for example an LBIST controller 118, are respectively operably coupled to the AMBA APB 104. In this regard, the connection of test-related functional elements, for example the LBIST status register 116, the LBIST controller 118 and other test logic for controlling power and clock signals, to the bus 102, as opposed to connection via a dedicated interface, such as a JTAG interface, and so are also connected to the peripherals connected to the bus 102. As such, self-test scanning is facilitated.

As in the case of the AMBA AHB 102, in order to support access to the AMBA APB 104 by other peripheral entities, the skilled person will also appreciate that other interfaces 120 can be provided to support operable coupling of other architectural blocks to the AMBA APB 104. In this example, an LBIST engine module 122 is operably coupled to the LBIST status register 116 and the LBIST controller 118.

Figure 2:
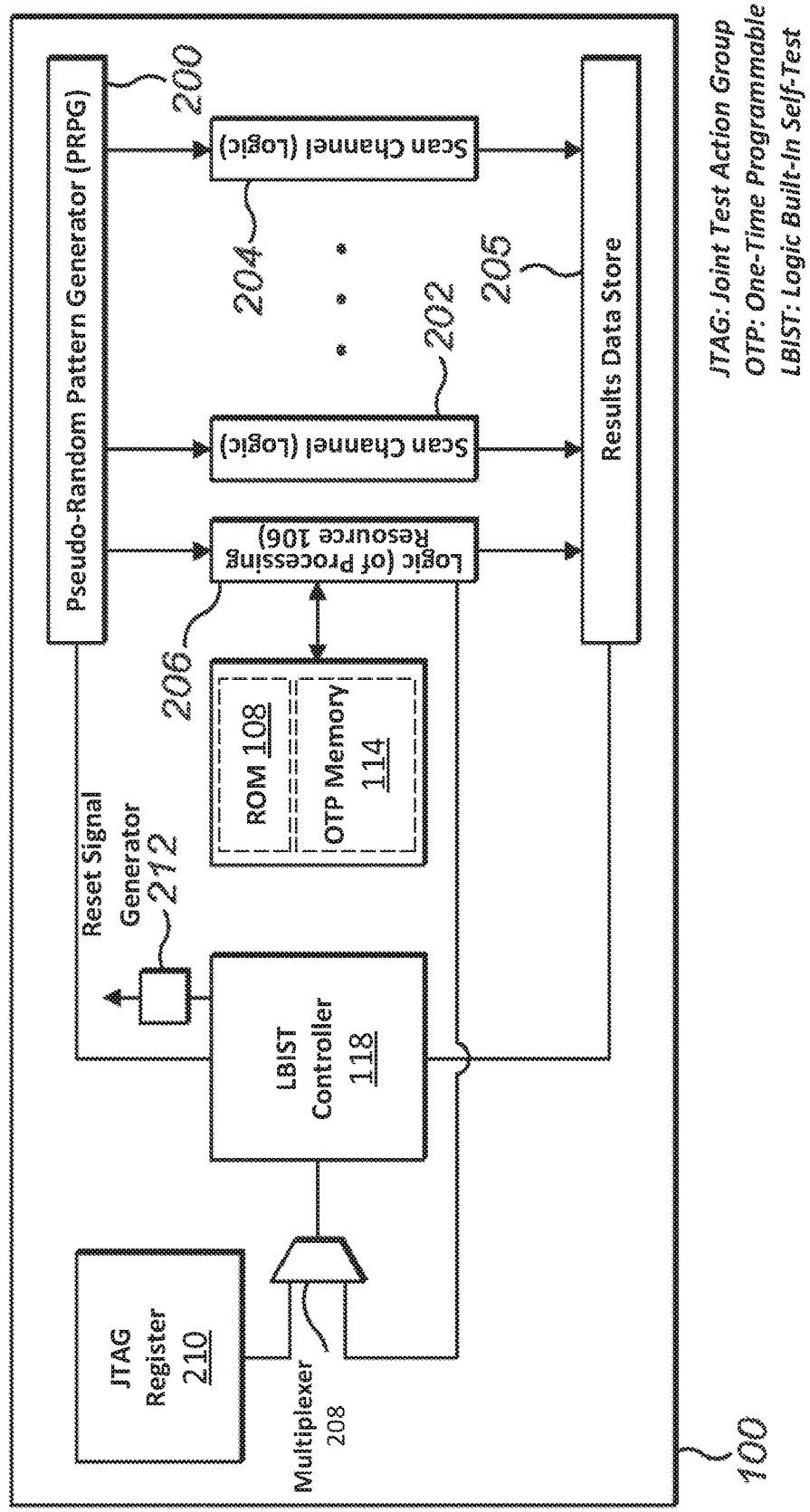
FIG. 2 is a schematic diagram of the integrated circuit of FIG. 1 in greater detail and configured as a self-test capable integrated circuit apparatus and constituting an embodiment of the invention.

The integrated circuit of FIG. 1 comprises testable logic that can be self-tested. In this example, the testable logic includes digital logic of the processing resource 106 as well as other digital logic of the integrated circuit requiring testing. To test the digital logic in a test mode, the functional blocks of the integrated circuit of FIG. 1 are reconfigurable so that test patterns can be applied to flip-flops of the digital logic. In this respect, by virtue of the digital logic of the processing resource 106 and/or the other digital logic of the integrated circuit being connected via a bus, for example the AMBA AHB 102 and the AMBA APB 104, the interconnection of the digital logic of different parts of the integrated circuit is reconfigurable. During normal operation of the integrated circuit, this functional connectivity permits different functional blocks of the integrated circuit to communicate over the bus. However, of particular benefit, the reconfigurable nature of the connectivity permits connectivity between digital logic configured for scan tests to be reconfigured as desired. As just mentioned, in such a test mode, the digital logic is reconfigured, for example as in FIG. 2. In this respect, the LBIST engine module 122 comprises a pattern generator, for example a Pseudo-Random Pattern Generator (PRPG) 200. The digital logic of the integrated circuit to be tested is reconfigured into a plurality of scan channels having respective inputs and outputs. For example, a first scan channel 202 has an input thereof operably coupled to the PRPG 200 and an output thereof operably coupled to a results data store 205, which in this example is part of the LBIST status register 116. A second scan channel (not shown) similarly has an input thereof operably coupled to the PRPG 200 and an output thereof operably coupled to the results data store 205. Similarly, an $n^{th}$ scan channel 204 has an input thereof operably coupled to the PRPG 200 and an output thereof operably coupled to the results data store 205.

In a like manner to the reconfiguration of a part of the digital logic described above, the logic 206 of the processing resource 106 is reconfigured at an appropriate time, for example after programming power and clock controllers to a stable state and programming of the LBIST controller 118, to provide an input thereof that is operably coupled to the PRPG 200 and an output thereof operably coupled to the results data store 205. The processing resource 106 is also operably coupled to on-chip memory resources, for example the ROM 108 and the OTP 114, to support self-testing in the examples set forth herein. The logic 206 of the processing resource 106 is also optionally operably coupled to a first input of a multiplexer 208, a second input of the multiplexer 208 being optionally operably coupled to JTAG registers 210 to support testing from a source external to the integrated circuit. An output of the multiplexer 208 is operably coupled to the LBIST controller 118. When the JTAG registers 210 and the multiplexer 208 are not employed, the logic 206 of the processing resource 106 is operably coupled to the LBIST controller 118. The LBIST controller 118 also has an output operably coupled to a reset signal generator 212 arranged to translate the test completed signal to a reset signal, which should for example be a low level pulse of short duration in order to prevent the integrated circuit 100 from becoming stuck in an unknown state after LBIST execution has finished.

Figure 3:
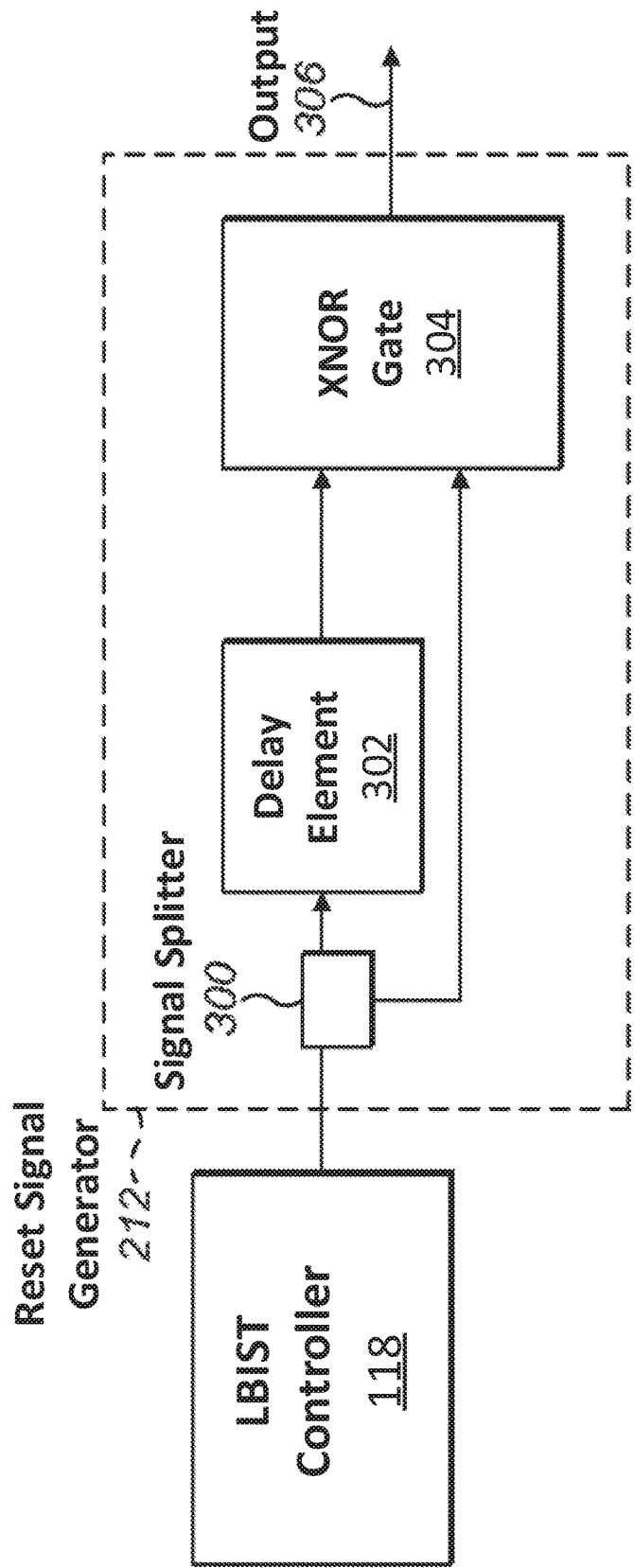
FIG. 3 is a schematic diagram of a reset circuit employed by the integrated circuit of FIG. 2.

The reset signal generator 212 (FIG. 3), is used to provide a "mechanism" for the integrated circuit 100 to recover automatically from a regime of implemented scan chains to one of functional connectivity of a normal operational mode (as opposed to a test mode). In this example, the reset signal generator 212 comprises an input operably coupled to the output of the LBIST controller 118 mentioned above. A signal splitter 300 is operably coupled to the input of the reset signal generator 212 and provides a first output and a second output, the first output being operably coupled to an input of a delay element 302, an output of the delay input being operably coupled to a first input of an XNOR gate 304. The second output of the signal splitter 300 is operably coupled to a second input of the XNOR gate 304. The XNOR gate 304 has an output 306 for providing the reset signal, the duration of which is defined by the delay provided by the delay element 302, assuming that the input signal to the delay element 302 changes its state. Of course, the skilled person should appreciate that this is simply one such implementation and other implementations are contemplated, for example where the signal splitter 300 is not present because the LBIST controller 118 is configured to drive both inputs of the XNOR gate 304 (or any other suitable logic) directly. In this respect, the above circuit arrangement is just one example of a number of implementations. Indeed, one or more parts of the circuit can be replaced with alternatives, for example the signal splitter 300 is an example of splitting a signal at a conceptual level and at a microelectronic circuit level the implementation either alone or in combination with other circuit elements can be implemented in a number of different ways using switching, for example transistor, devices.

Figure 4:
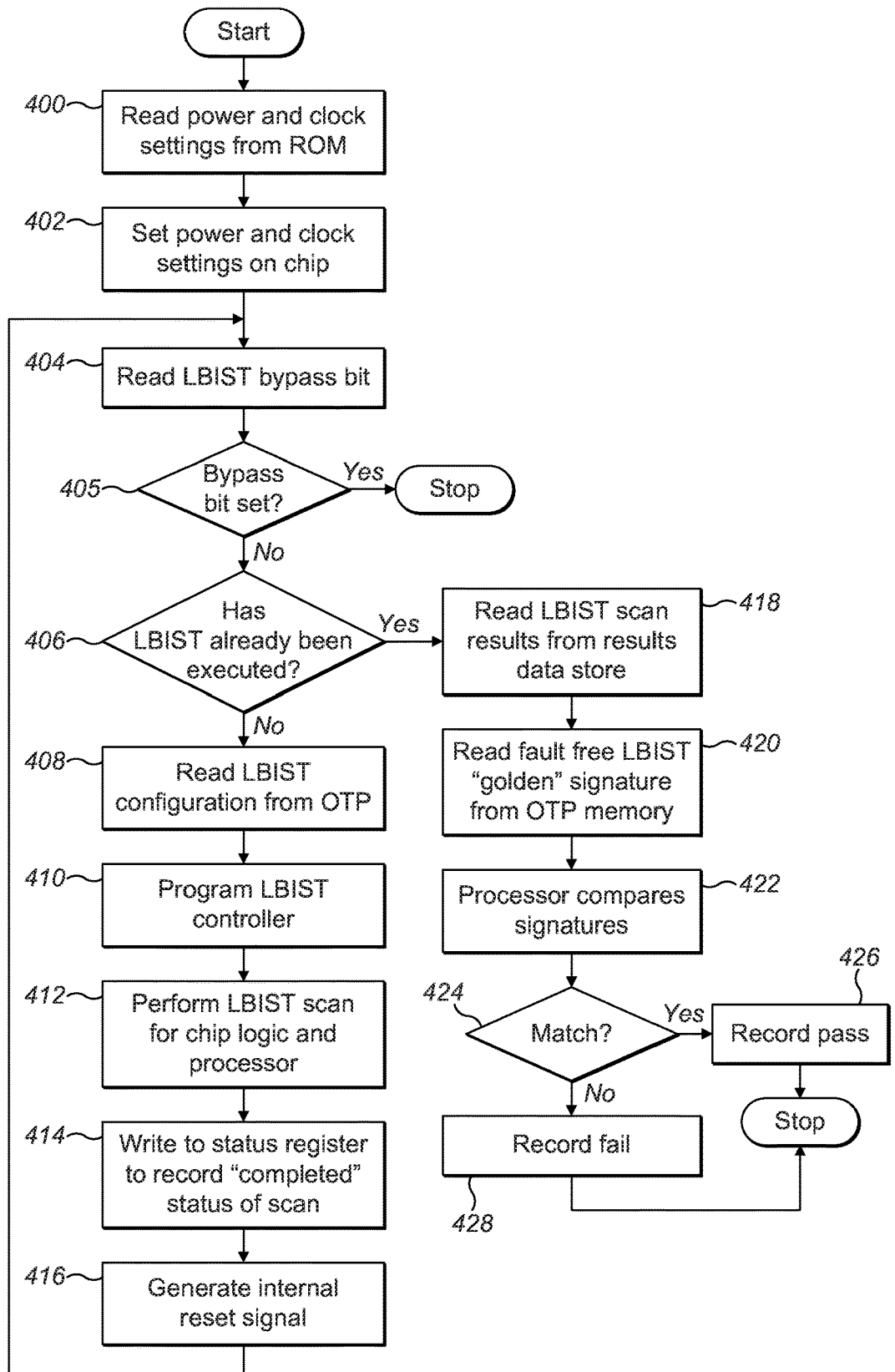
FIG. 4 is a flow diagram of a method of self-testing an integrated circuit and constituting another embodiment of the invention.

In operation (FIGS. 4 and 5), the processing resource 106 is, for example, powered-up, and the processing resource 106 reads (Step 400) the ROM 108 to obtain power and clock settings, which the processing resource 106 uses to set (Step 402) the power controller 112 and a clock controller (not shown) of the integrated circuit 100. Referring to FIG. 5, a hardware reset signal, HW_RSTN (FIG. 5), is generated when the processing resource 106 is woken-up and a reference clock signal, REFCLK (FIG. 5), begins to cycle. In some implementations, more than one clock can be employed.

Once the power and clock controllers have been set, the processing resource 106 accesses (Step 404) a bypass status register, which for example can be stored in the OTP memory 114, to examine a bypass bit stored therein to determine (Step 405) whether self-testing is to be skipped. In the event that the bypass bit is set to indicate that self-testing should be bypassed, the processing resource 106 continues to enter a normal operational mode from a test mode where the processing resource 106 performs its primarily intended functional behaviour. Otherwise, the processing resource 106 continues in its self-test mode and accesses the LBIST status register 116 in order to determine (Step 406) whether a self-test has already been performed. In some circumstances, for example in the event that the integrated circuit 100 becomes stuck in an infinite loop due to improper self-test execution, this bypass feature can be employed to avoid risk and/or for debug and diagnosis purposes. Examples of risks include the integrated circuit 100 becoming stuck in an infinite loop, but another risk is the self-test completes but the processing resource 106 does not recover functional connectivity and following issuance of a software reset signal. It should also be appreciated that the manner of programming the bypass status register can depend upon whether self-testing is to be performed by default or not. In this respect, in one implementation the integrated circuit 100 can be configured to set the bypass status register to reflect a default status of the self-test being deactivated, requiring the bypass status register to be programmed in a predetermined manner to indicate deviation from this default status, i.e. to indicate that a self-test is to be executed. In the present implementation described herein, the integrated circuit 100 is configured to execute the self-test by default, requiring the bypass status register to be programmed to set the status of execution of the self-test to "disabled".

In the event that the LBIST status register 116 does indicate that a self-test has not been performed, which is determined upon completion of the power-up sequence for the testable logic, for example in the process described herein after the bypass bit has been read and analysed (Steps 405 and 406), responsive to the analysis of the bypass bit indicating that the self-test needs to be performed, the processing resource 106 enters a self-test mode and reads (Step 408) LBIST configuration data from the OTP memory 114. The processing resource 106 then programs (Step 410) the LBIST controller 118 with the parameters obtained from the OTP memory 114 so that the LBIST controller 118 is able to supervise the self-test in accordance with the LBIST configuration data. Thereafter, LBIST controller 118 changes state of an LBIST_START (FIG. 5) signal that is communicated to the PRPG 200 and the results data store 205, and then the LBIST controller 118 performs (Step 412), in this example, LBIST scans by executing the programming provided by the processing resource 106. The LBIST scanning, i.e. the self-testing, is performed on the digital logic of the integrated circuit, which includes the digital logic of the processing resource 106, by applying digital data patterns generated by the PRPG 200 to the respective inputs of the logic 206 of the processing resource 106 and the plurality of scan channels 202, 204, the digital logic responding by generating output data that is used by the LBIST controller 118 to calculate output signature data that is stored in the results data store 205 for subsequent evaluation. As the detail of the testing of the flip-flops of the digital logic is not core to an understanding of the embodiments set forth herein, the generation and application of the digital data patterns will not be described in further detail. However, it should be appreciated that the processing resource 106 and the other digital logic, for example the plurality of scan channels 202, 204 are tested by the self-test substantially simultaneously.

Once scanning has been completed, the LBIST controller 118 writes (Step 414) to the LBIST status register 116 in order to indicate that the self-test has been performed and has been completed. The LBIST controller 118 also changes a state of a test completed or LBIST_DONE signal at the output thereof that is coupled to the reset signal generator 212. In this respect, while the self-test is being performed, the status of the LBIST_DONE signal is logic LOW. At the reset signal generator 212, the logic LOW signal is split and subject to a delay along one signal path before being applied to the XNOR gate 304, whereas the undelayed logic LOW signal follows another signal path and is applied directly to the XNOR gate 304. The XNOR gate 304 responds by generating a logic HIGH output signal (SW_RSTN in FIG. 5). However, when the self-test is completed, the LBIST_DONE signal changes state to a logic HIGH signal. At the reset signal generator 212, the undelayed logic HIGH step is applied directly to the XNOR gate 304, whereas the delayed version results in a logic LOW signal being applied to the XNOR gate 304 for a predetermined period of time before the change of state of the delayed LBIST_DONE signal reaches the XNOR gate 304. In this circumstance, a logic HIGH and a logic LOW signal are both applied to the XNOR gate 304 for a predetermined period of time dictated by the delay introduced by the delay element 302. Responsive to these two signal levels, the XNOR gate 304 transitions the SW_RSTN signal from the logic HIGH signal previously output, when the LBIST_DONE signal was logic LOW, to logic LOW (Step 416) for a predetermined period of time corresponding to the above-mentioned delay before returning to the logic HIGH level, the temporary change of logical state being pulse-shaped.

The integrated circuit responds to the reset signal (SW_RSTN) generated at the output of the reset signal generator 212 by resetting itself and the processing resource 106 reloads code to enter or boot into the self-test mode. In another example, the processing resource 106 can repeat the initialisation steps (Steps 400 and 402). Indeed, reading of the boot sequence from the ROM 108 enables support to be provided for different boot scenarios and different restart points, for example requiring initialisation steps or omitting them.

In the present example, though, after resetting itself the processing resource 106 accesses the LBIST status register 116 in order to determine (Step 406) whether a self-test has already been performed. However, this time the processing resource 106 finds that the LBIST register 116 has been set to indicate that a self-test has been performed.

As such, instead of reconfiguring itself, the processing resource 106 now undertakes an evaluation of the result data generated as a result of performance of the self-test, i.e. in response to the LBIST register 116 being set to indicate that the self-test has been performed. In this respect, the processing resource 106 reads (Step 418) the result data from the results data store 205 and reads (Step 420) expected result data, sometimes referred to as a "golden" signature, from the OTP memory 114. The processing resource 106 then compares (Step 422) the result data with the expected result data. The processing resource 106 then determines (Step 424) whether the comparison has resulted in the result signature data and the expected result data matching. In the event that a match has been found, the processing resource 106 records (Step 426) a match, otherwise the processing resource 106 records (Step 428) a fail in respect of the self-test. When the self-test is recorded as a pass, the processing resource 106 exits the self-test mode and engages in the primarily intended functional behaviour mentioned above. However, where the self-test is recorded as a fail, the failed test is handled in accordance with a failed self-test protocol of the designer of the integrated circuit. As this protocol is not core to an understanding of the inventive principles set forth herein, details of the protocol will not be described.

Hence, it can be seen that the LBIST controller 118 cooperates with the processing resource 106 in order to permit the processing resource 106 to evaluate the results of the self-test, but also to permit the processing resource 106 to be tested as part of the self-test. The processing resource 106 enters into the self-test mode, for example when the logic 206 of the processing resource 106 is reconfigured as one or more scan chains, after booting, for example after powering-up or resetting, in order to perform the tasks mentioned above, namely programming of the LBIST controller 118 and evaluation of the self-test result data.

The skilled person should appreciate that the above-described implementations are merely examples of the various implementations that are conceivable within the scope of the appended claims. Indeed, throughout the above description, reference has been made to a processing resource, for example a processor. However, it should be understood that the processing resource can be any digital logic of the integrated circuit that is capable of controlling or supervising a power-up sequence of the integrated circuit and so support having its operation modes sequenced in the manner described above.

Additionally, the examples of self-test described above have been in the context of LBIST. However, the skilled person should appreciate that the techniques and arrangements described above are intended for implementation in respect of other self-test methodologies, where it is desirable to perform a self-test in respect of digital logic, where the digital logic comprises logic used to implement at least part of the self-test.

In the above examples, the self-test process is initiated upon powering-up of the integrated circuit 100. In this respect, the test can be initiated using any suitable mechanism, for example the initiation of the test can be supported in the boot-ROM and can be periodic, for example every hour or day. Alternatively, or additionally, the test can be initiated on an on-demand basis, for example through an instruction provided by a user through a peripheral of an apparatus comprising the integrated circuit 100 capable of self-testing, such as through a Universal Serial Bus port (not shown).

The systems and methods of the above embodiments may be implemented in a computer system (in particular in computer hardware or in computer software) or in specifically manufactured or adapted integrated circuits, in addition to the structural components and user interactions described.

Reference herein to logic HIGH and logic LOW should be understood to refer to digital logic levels. In this respect, the examples set forth herein are assumed to employ binary logic, for example 1 and 0 to represent logic HIGH and logic LOW, respectively. However, the skilled person should understand that the principles described herein can be applied to any suitable logic scheme employed subject to application preferences.

The methods of the above embodiments may be provided as computer programs or as computer program products or computer readable media carrying a computer program which is arranged, when run on a computer or other processor, to perform the method(s) described above.

The term "computer readable media" includes, without limitation, any medium or media which can be read and accessed directly by a computer or computer system. The media can include, but are not limited to, magnetic storage media such as floppy discs, hard disc storage media and magnetic tape; optical storage media such as optical discs or CD-ROMs; electrical storage media such as memory, including RAM, ROM and flash memory; and hybrids and combinations of the above such as magnetic/optical storage media.

While specific examples of the invention have been described above, the skilled person will appreciate that many equivalent modifications and variations are possible. Accordingly, the exemplary embodiments of the invention set forth above are considered to be illustrative and not limiting. Various changes to the described embodiments may be made without departing from the spirit and scope of the invention.

What is claimed is:

1. Integrated circuit apparatus, comprising:
   a pattern generator configured to generate digital data patterns;
   a results store configured to store self-test result data;
   testable logic comprising a processor and a plurality of scan channels, the test logic being operably coupled between the pattern generator and the results store, and the scan channels comprising digital logic circuits of the integrated circuit apparatus;
   at least one memory for storing instructions; and
   a self-test controller configured to supervise a self test on the testable logic by using the digital data patterns to:
     generate the self-test result data; and
     store the self-test result data in the results store;
   wherein the processor is operably coupled to the self-test controller and configured to execute the instructions to perform operations comprising:
     causing the self-test controller to perform the self test on the processor; and
     evaluating the self-test result data stored in the results store.

2. The apparatus according to claim 1, further comprising:
   a test-completed indicator store, wherein the self-test controller is configured to modify a content of the test-completed indicator store upon completion of the self test, thereby storing an indication that the self test has been completed.

3. The apparatus according to claim 2, wherein
   the processor comprises a normal operating mode and a self-test mode; and
   the processor temporarily enters the self-test mode upon booting.

4. The apparatus according to claim 3, wherein when the processor is in the self-test mode, the operations further comprise:
   accessing the test-completed indicator store in order to determine whether the self test has been performed.

5. The apparatus according to claim 4, wherein evaluating the self-test result data comprises:
   evaluating the self-test result data when the test-completed indicator store contains an indication that the self test has been performed.

6. The apparatus according to claim 5 further comprising:
   an expected-results data store configured to store expected self-test result data,
   wherein evaluating the self-test result data comprises:
     accessing the expected-results data store and the results store, and
     comparing the self-test result data with the expected self-test result data.

7. The apparatus according to claim 1, wherein the self-test controller is configured to generate a test-completed signal.

8. The apparatus according to claim 7, further comprising:
   a reset circuit configured to translate the test-completed signal into a reset signal.

9. The apparatus according to claim 8, wherein the reset signal is a pulse-shaped signal.

10. The apparatus according to claim 8, wherein the reset circuit comprises a logical XNOR gate comprising:
    a first input configured to receive the test-completed signal;
    a second input configured to receive a time-delayed version of the test-completed signal; and
    an output terminal outputting the reset signal.

11. The apparatus according to claim 10, further comprising:
    a delay element configured to receive the test-completed signal and delay the test-completed signal by a predetermined period of time, thereby generating the time-delayed version of the test-completed signal.

12. The apparatus according to claim 1, wherein the self test on the scan channels is performed substantially simultaneously with the self test on the processor.

13. The apparatus according to claim 1, wherein:
    the testable logic is associated with a power-up sequence; and
    the operation of causing the self-test controller to perform the self test on the processor is performed after the power-up sequence is completed.

14. The apparatus according to claim 13, wherein the self-test controller is configured to:
    execute a program provided by the processor after the processor causes the self-test controller to perform the self test.

15. A method of self-testing an integrated circuit, the method comprising:
    causing a self-test controller to perform a self test on testable logic of the integrated circuit, wherein the testable logic comprises a processor and a plurality of scan channels, the scan channels comprising digital logic circuits of the integrated circuit;

performing the self test on the processor and the scan channels by applying digital data patterns to inputs of the processor and the scan channels;

storing result data of the performed self test on the processor and scan channels;

resetting the testable logic; and evaluating the result data by the processor.

16. The method according to claim 15, further comprising:

generating a test-completed signal.

17. The method according to claim 16, further comprising:

generating a reset signal by a logical XNOR operation, wherein:

a first input of the logical XNOR operation comprises the test-completed signal, a second input of the logical XNOR operation comprises a time-delayed version of the test-completed signal, and an output of the logical XNOR operation comprises the reset signal.

18. The method according to claim 15, wherein:

the processor comprises a normal operating mode and a self-test mode; and the processor temporarily enters the self-test mode upon booting.

19. The method according to claim 15, wherein the self test on the scan channels is performed substantially simultaneously with the self test on the processor.

20. The method according to claim 15, further comprising:

performing a power-up sequence associated with the testable logic before causing the self-test controller to perform the self test on testable logic.

* * * * *

UNITED STATES PATENT AND TRADEMARK OFFICE
CERTIFICATE OF CORRECTION

PATENT NO. : 10,496,506 B2
APPLICATION NO. : 15/815847
DATED : December 3, 2019
INVENTOR(S) : Yassine Fkih et al.

Page 1 of 1

It is certified that error appears in the above-identified patent and that said Letters Patent is hereby corrected as shown below:

On the Title Page

Item (30), Line 1, "Nov. 18, 2016 (EP) 16199631" should read -- Nov. 18, 2016 (EP) 16199631.9 --.

Signed and Sealed this
Twenty-eighth Day of January, 2020

Andrei Iancu
*Director of the United States Patent and Trademark Office*